United States Patent [19]
Hosaka

[11] Patent Number: 5,118,636
[45] Date of Patent: Jun. 2, 1992

[54] PROCESS FOR FORMING ISOLATION TRENCH IN ION-IMPLANTED REGION

[75] Inventor: Takashi Hosaka, Tokyo, Japan

[73] Assignee: Seiko Instruments Inc., Japan

[21] Appl. No.: 269,437

[22] Filed: Nov. 9, 1988

[30] Foreign Application Priority Data

Nov. 11, 1987 [JP] Japan ................. 62-284856

[51] Int. Cl.⁵ ............................. H01L 21/76
[52] U.S. Cl. ............................. 437/35; 437/65; 437/67
[58] Field of Search .......... 437/20, 35, 67, 16, 437/65, 66

[56] References Cited

U.S. PATENT DOCUMENTS

4,534,824  8/1985  Chen ........................... 437/67

FOREIGN PATENT DOCUMENTS

| 0098687 | 1/1984 | European Pat. Off. |
| 0255973 | 2/1988 | European Pat. Off. |
| 58-46647 | 3/1983 | Japan ................. 437/67 |
| 59-80942 | 5/1984 | Japan ................. 437/67 |
| 61-47650 | 3/1986 | Japan ................. 437/67 |
| 61-219150 | 9/1986 | Japan ................. 437/67 |
| 61-244044 | 10/1986 | Japan ................. 437/67 |
| 63-278326 | 11/1988 | Japan ................. 437/66 |
| 1223727 | 9/1989 | Japan ................. 437/65 |
| WO85/04516 | 10/1985 | PCT Int'l Appl. ........ 437/67 |

*Primary Examiner*—Olik Chaudhuri
*Assistant Examiner*—G. Fourson
*Attorney, Agent, or Firm*—Bruce L. Adams; Van C. Wilks

[57] ABSTRACT

A process for manufacturing a trench isolation device is mainly comprised of steps of forming a trench in an impurity ion doped region in a semiconductor substrate after the impurity ion doped region has been formed by ion implantation. The ion energy for the ion implantation is charged from a low energy level to a high energy level, or vice versa, in order to provide a uniform vertical doping profile or a graded vertical doping profile. By this method, field dope layers completely surround the trench in the trench isolation device.

10 Claims, 2 Drawing Sheets

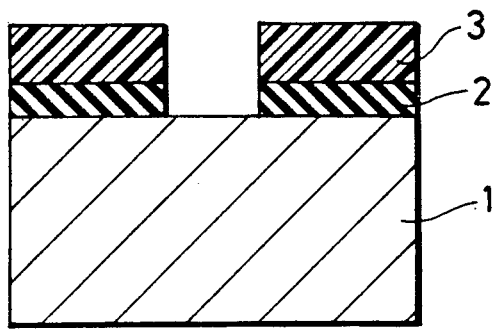
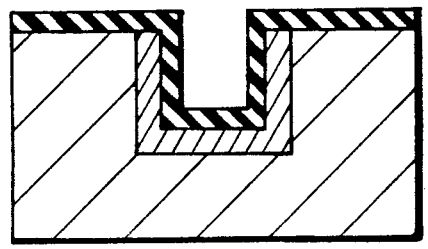
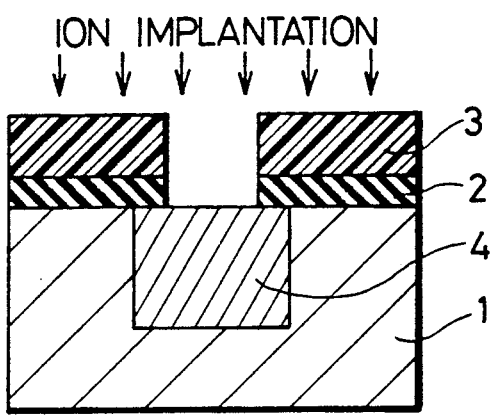
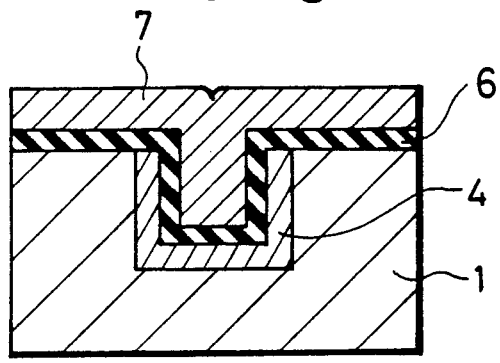
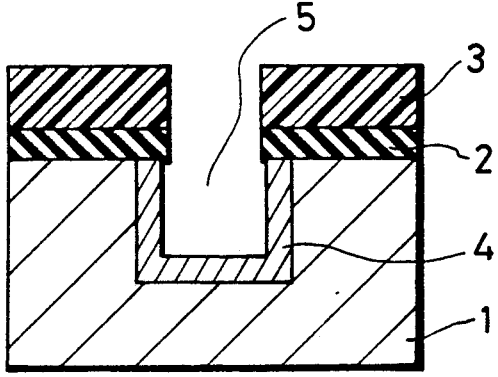
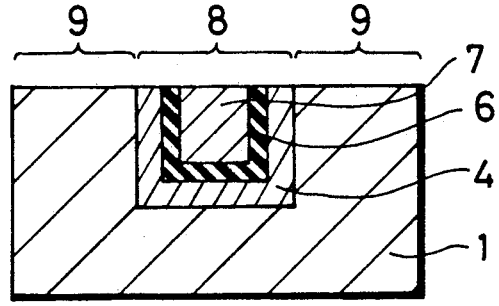

ION IMPLANTATION

PROCESS FOR FORMING ISOLATION TRENCH IN ION-IMPLANTED REGION

BACKGROUND OF THE INVENTION

1. Field of industrial utility

This invention relates to a method of manufacturing semiconductor devices, particularly relates to a method of trench isolation.

2. Prior arts

An isolation region has incessantly been reduced in size with the miniaturization of a semiconductor device. In this trend, the trench isolation was recently proposed and has been under development. In the trench isolation, as shown in FIG. 2, trenches 14 are formed to serve as isolation regions 13 in order to electrically isolate active areas 12 in which devices such as transistors are formed. The device isolation capacity increases with the increase of the depth of the trench 14. In order to improve the device isolation capacity and to prevent the inversion of polarity, the impurity concentration of the semiconductor substrate at the device isolation region 13 is generally made higher than that of the active area. This region 15 is called a field dope region. Generally, the field dope region 15 is formed by ion implantation after trenches have been provided. However, when a trench is deep, a part of the trench is not implanted with ions. As shown in FIG. 3, because the incident angle of ions for ion implantation is adjusted at 7° in order to prevent the channeling phenomenon, ions are consequently blocked by a masking resist 23 during ion implantation, which phenomenon is called the shadowing effect, and a part 25 of the trench is not implanted with ions.

The rotating ion implantation method is used in order to prevent the shadowing effect. However this method requires a complex apparatus, and the control of the apparatus is extremely difficult. There is another method called the "zero degree ion implantation method", in which ions are implanted vertically relative to the surface of the semiconductor substrate. However the drawback of this method is that ions are difficult to be implanted in the walls of the trench.

Besides the ion-implantation methods, the diffusion method is used, in which a film containing an impurity is formed on the walls of a trench after the trench has been formed, and the impurity is diffused from the film into the walls of the trench. However this method requires complicated steps. Further, since the amount of the impurity required for field doping is at most $10^{16}$–$10^{18}$/cm$^3$, it is difficult to control the impurity concentration at this low level by the diffusion method.

As described in the foregoing, it is extremely difficult for the conventional trench isolation method to uniformly dope the walls of a trench with a desired impurity concentration, and therefore it is almost impossible to obtain stable device isolation characteristics.

SUMMARY OF THE INVENTION

It is therefore an object of the present invention to provide a method of the trench isolation in which a trench is provided after an impurity doped layer has been formed in a substrate by ion implantation. It is another object of the present invention to provide a method to form impurity doped walls of a trench in a trench isolation device. It is still another object of the present invention to provide a method to form a graded doping profile or a uniform doping profile along the side walls of a trench in the trench isolation.

BRIEF DESCRIPTION OF THE DRAWINGS

FIG. 1 shows, in section, the steps of manufacturing a semiconductor device according to the present invention.

PREFERRED EMBODIMENTS OF THE INVENTION

Figure 2:
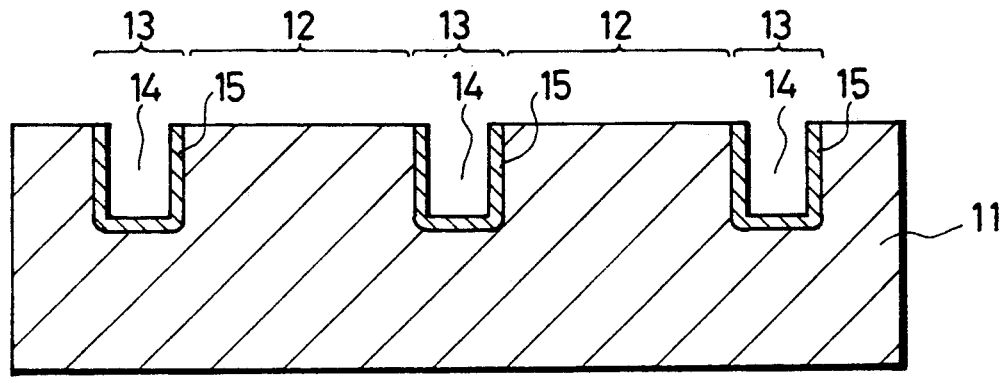
FIG. 2 shows a section of a semiconductor device of the prior art.
Figure 3:
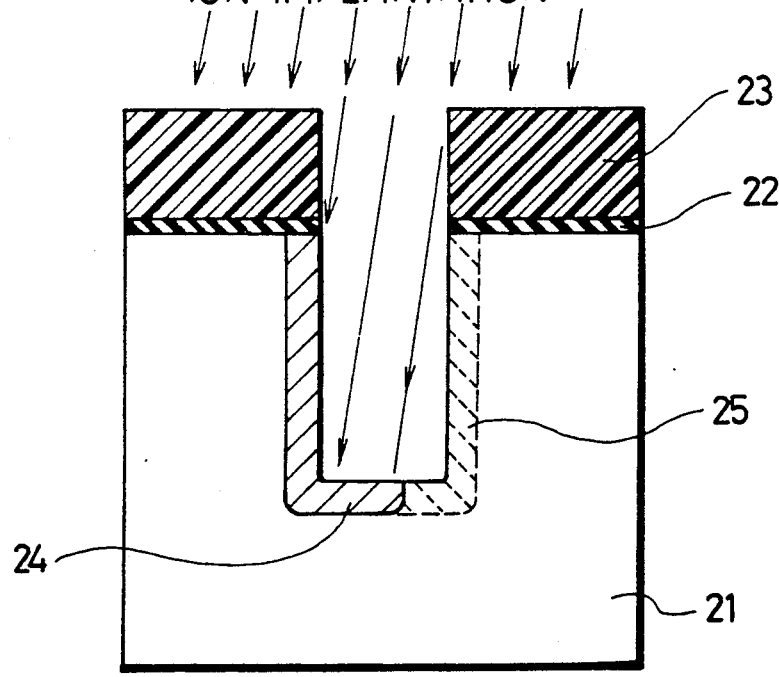
FIG. 3 illustrates the shadowing effect during ion implantation to a semiconductor device.

The most essential feature of the present invention resides in the formation of a field dope layer by ion implantation before the provision of a trench. A preferred embodiment of the present invention is hereunder described in detail with reference to FIG. 1. As shown in FIG. 1(a), an insulation film 2 is provided on a semiconductor substrate 1. The semiconductor substrate 1 may be comprised of silicon (Si), germanium (Ge), gallium arsenide (GaP), indium phosphide (InP), gallium phosphide (GaP), or others. The insulation film 2 may be comprised of a silicon dioxide (SiO$_2$) film formed by thermal oxidation in the case of silicon, or an insulation film deposited by chemical vapor deposition (CVD). Thereafter a photoresist 3 is applied thereon, a window is opened at a portion at which a device isolation area is formed, and the insulation film 2 is etched away using the photoresist 3 as a mask. For the etching of the insulation film 2, either dry etching or wet etching can be used.

As shown in FIG. 1(b), using a high energy ion implantation apparatus, the semiconductor substrate 1 is ion implanted at the window with impurity ions such as phosphorous (P), arsenic (As), antimony (Sb), boron (B), etc. In this ion implantation method, the semiconductor substrate 1 is implanted with ions from its surface to a depth adjacent to the bottom of a trench to be formed later. In this case, the ion energy for ion implantation is varied from a low ion energy level of 10–30 KeV to a high ion energy level with which ions can be implanted to a depth of several $\mu$m. (For example, 5 $\mu$m deep boron implantation into a silicon substrate requires an acceleration energy of 3 MeV.) Further, the amount of implanting ions may be controlled according to the requirements to provide either a vertically uniform doping profile or a vertically graded doping profile. The ion implantation can be carried out by gradually increasing the acceleration energy from a low energy level to a high energy level, or by decreasing the energy from a high energy level to a low energy level. Of course, the acceleration energy can be changed according to a desired sequence.

A layer of the insulation film 2 and the photoresist 3, which serves as a mask for ion implantation, should have a sufficient thickness to stop the penetration of ions into the semiconductor substrate 1 when the ion implantation is carried out with a maximum energy. It is of course possible to reduce the total thickness of the layer by inserting, between the insulation film 2 and the photoresist 3, a material having a large capacity to stop ions. On the other hand, impurity ions implanted at a high energy level may be intentionally introduced into the semiconductor substrate 1 thereby forming for example a well in the semiconductor substrate.

As shown in FIG. 1(c), by an anisotropic etching such as the reactive ion etching, a trench 5 having a desired depth is formed using the insulation film 2 and the photoresist 3 as a mask. Even when the side walls of the trench are etched away relative to the opening of the mask, the horizontal diffusion of impurity ions are generally large and therefore as shown in FIG. 1(c) the trench 5 is surrounded by a field dope layer 4. It is also possible to provide a trench 5 by the following steps: ion implantation is carried out as shown in FIG. 1(b), the resist 3 is removed, annealing is carried out to diffuse implanted ions to some degree, and the trench 5 is formed. In this case, the insulation film 2 is used as a mask for etching.

A process to be carried out thereafter is the same as the ordinary trench isolation process. For example, as shown in FIG. 1(d), after the insulation film 2 is removed, the semiconductor substrate 1 is oxidized. The oxidation may be carried out in a manner that the etched corners are rounded. Then as shown in FIG. 1(e), a polycrystal silicon layer 7 is deposited thereon by CVD during which the trench is filled with polycrystal silicon. Of course besides polycrystal silicon, other materials can also be used to fill the trench. The surface of the semiconductor substrate 1 is planarized by etching as shown in FIG. 1(f) to thereby form a device isolation area 8 and an active area 9. In the active areas, semiconductor devices, etc are formed in later steps. The most important point of the present invention resides in the ion implantation method. According to the present invention, ions are implanted in a semiconductor substrate from its surface to the depth. For such ion implantation, either a single ion implantation apparatus or several ion implantation apparatus may be used. In the later case, an ion implantation apparatus suitable for low energy acceleration is used in combination with an ion implantation apparatus suitable for high energy acceleration.

As long as the ion implanted layer 4 and the trench 5 can be formed, the insulation film 2 used in the step shown in FIG. 1 can be deleted.

The mask to be used for the present invention becomes thicker as the depth of the ion implanted layer or the depth of the trench becomes deeper, accordingly the shadowing effect is also a problem during ion implantation. The solution to this problem is to reduce the thickness of the mask layer by inserting a material having a large capacity to stop ions, or to carry out the "zero degree ion implantation", the ion implantation carried out as vertically as possible in relative to the surface of a semiconductor substrate. When the channeling effect is desired to be prevented during the zero degree ion implantation, the ion implantation is carried out after the semiconductor substrate is covered with a thin insulation film. According to the present invention, since a trench is formed after ion implantation, there is not a chance that a field dope layer is not formed n the walls of the trench as seen in the conventional method, and the field dope layer can be provided with a desired impurity concentration. Although the present invention is sued for the trench isolation as described in the foregoing, it is obvious that the present invention is also applicable to the manufacturing of trench capacitors.

I claim:

1. A method of trench isolation comprising the steps of forming an ion-implanted layer having a predetermined doping profile of a predetermined width and penetrating to a predetermined depth in a region of a semiconductor substrate, and providing a trench in said ion-implanted layer the width an depth of which are less respectively than said predetermined width and depth.

2. The method of trench isolation defined in claim 1; wherein aid step of forming an ion-implanted layer comprises the steps of forming an insulation film on the surface of the semiconductor substrate; depositing a photoresist on said insulation film and opening a window therein to define said region in which the trench is to be formed, etching said insulation film, and forming aid ion implanted layer in the area confined by the window by ion implantation with ion energy ranging from substantially a predetermined low energy level to substantially a predetermined high energy level.

3. The method of trench isolation defined in claim 2; wherein said step of forming an ion implanted layer comprises the step of changing the acceleration energy for ion implantation between a predetermined low energy level and a predetermined high energy level.

4. The method of trench isolation defined in claim 2; wherein said step of forming an ion implanted layer comprises the step of controlling the amount of implanting ions to provide one of a vertically uniform doping profile and a vertically graded doping profile at said region in the semiconductor substrate in which the trench is provided later.

5. The method of trench isolation defined in claim 2; further comprising the step of using a material substantially opaque to the ions as a mask for ion implantation.

6. The method of trench isolation defined in claim 2; further comprising a step of ion implanting at an implantation angle of ±5° from the normal to the surface of the semiconductor substrate.

7. A process for fabricating isolated grooves in a semiconductor substrate, comprising the steps of:
   determining an area of the substrate in which a groove is to be formed;
   implanting selected ion impurities in said substrate area to form an isolation region having a predetermined doping profile; and
   forming a groove within said isolation region such that said groove is isolated on all sides thereof from the substrate by said isolation region.

8. The process of claim 7; in which the bottom and sidewalls of said groove are formed of said selected ion impurities defining said isolation region.

9. The process of claim 7; in which said ion-implanting step comprises the step of forming said isolation region of predetermined depth and width.

10. The process of claim 7; in which said step of forming said isolation region comprises varying the acceleration energy for ion-implantation between a first energy level and a second relatively higher energy level.

* * * * *